(12) United States Patent
Japp et al.

(10) Patent No.: US 7,931,830 B2
(45) Date of Patent: Apr. 26, 2011

(54) DIELECTRIC COMPOSITION FOR USE IN CIRCUITIZED SUBSTRATES AND CIRCUITIZED SUBSTRATE INCLUDING SAME

(75) Inventors: Robert M. Japp, Vestal, NY (US); Voya R. Markovich, Endwell, NY (US); Kostas I. Papathomas, Endicott, NY (US)

(73) Assignee: Endicott Interconnect Technologies, Inc., Endicott, NY (US)

( * ) Notice: Subject to any disclaimer, the term of this patent is extended or adjusted under 35 U.S.C. 154(b) by 1574 days.

(21) Appl. No.: 11/265,287

(22) Filed: Nov. 3, 2005

(65) Prior Publication Data

US 2006/0054870 A1    Mar. 16, 2006

Related U.S. Application Data

(63) Continuation-in-part of application No. 10/812,889, filed on Mar. 31, 2004, now Pat. No. 7,270,845.

(51) Int. Cl.
*H01B 3/24* (2006.01)
*H01L 29/51* (2006.01)

(52) U.S. Cl. .................. 252/570; 252/573; 252/578

(58) Field of Classification Search ............... 252/570, 252/573, 578
See application file for complete search history.

(56) References Cited

U.S. PATENT DOCUMENTS

| | | | |
|---|---|---|---|
| 3,953,566 A | 4/1976 | Gore | |
| 4,187,390 A | 2/1980 | Gore | |
| 4,482,516 A | 11/1984 | Bowman et al. | |
| 5,126,192 A | 6/1992 | Chellis et al. | |
| 5,418,689 A | 5/1995 | Alpaugh et al. | |
| 5,652,055 A | 7/1997 | King et al. | |
| 5,733,823 A * | 3/1998 | Sugioka et al. | 442/110 |
| 6,207,595 B1 | 3/2001 | Appelt et al. | |
| 6,214,468 B1 * | 4/2001 | Takano et al. | 428/418 |
| 6,323,436 B1 | 11/2001 | Hedrick et al. | |
| 6,632,511 B2 * | 10/2003 | Zhang | 428/209 |
| 2006/0069201 A1 * | 3/2006 | Kondo et al. | 524/502 |

* cited by examiner

*Primary Examiner* — Robert D. Harlan
(74) *Attorney, Agent, or Firm* — Mark Levy; Lawrence R. Fraley; Hinman, Howard & Kattell

(57) ABSTRACT

A dielectric composition which is adapted for combining with a supporting material ( e.g., fiber-glass cloth) to form a dielectric layer usable in circuitized such as PCBs, chip carriers and the like. As such a layer, it includes a resin, a predetermined percentage by weight of a filler, and, significantly, only a minor amount of bromine. A circuitized substrate comprised of one or more of these dielectric layers and one or more conductive layers is also provided.

17 Claims, No Drawings

DIELECTRIC COMPOSITION FOR USE IN CIRCUITIZED SUBSTRATES AND CIRCUITIZED SUBSTRATE INCLUDING SAME

CROSS-REFERENCE TO CO-PENDING APPLICATIONS

In Ser. No. 10/812,890, entitled, "Circuitized Substrate, Method Of Making Same, Electrical Assembly Utilizing Same, And Information Handling System Utilizing Same", filed Mar. 31, 2004 (inventors: R. Japp et al), there is defined a circuitized substrate, electrical assembly and information handling system capable of utilizing dielectric layers made using the dielectric composition taught herein. A method of making the substrate is also defined in this co-pending application.

In Ser. No. 10/812,889, entitled "Dielectric Composition For Forming Dielectric Layer For Use In Circuitized Substrates", also filed Mar. 31, 2004 (inventors R. Japp et al), there is defined a dielectric composition which forms a dielectric layer usable in circuitized substrates such as PCBs, chip carriers and the like. As such a layer, it includes a cured resin material and a predetermined percentage by weight of particulate fillers, thus not including continuous fibers, semi-continuous fibers or the like as part thereof.

The present application is a continuation-in-part of Ser. No. 10/812,889, filed Mar.31, 2004, now U.S. Pat. No. 7,270,845.

In Ser. No. 10/920,235, entitled "Low Moisture Absorptive Circuitized Substrate, Method Of Making Same, Electrical Assembly Utilizing Same, And Information Handling System Utilizing Same", filed Aug. 18, 2004 (inventors: I. Memis et al), there is defined a circuitized substrate comprising a first layer comprised of a dielectric material including a low moisture absorptive polymer resin in combination with a nodular fluoro-polymer web encased within the resin, the resulting dielectric layer formed from this combination not including continuous or semi-continuous fibers as part thereof. The substrate further includes at least one circuitized layer positioned on the dielectric first layer. An electrical assembly and a method of making the substrate are also provided, as is an information handling system (e.g., computer) incorporating the circuitized substrate of the invention as part thereof.

In Ser. No. 11/086,323, entitled "Low Moisture Absorptive Circuitized Substrate, Method Of Making Same, Electrical Assembly Utilizing Same, And Information Handling System Utilizing Same", filed Mar. 23, 2005 (inventors: I. Memis et al), there is defined a circuitized substrate including a composite layer including a first dielectric sub-layer including a plurality of fibers having a low coefficient of thermal expansion and a second dielectric sub-layer of a low moisture absorptivity resin, the second dielectric sub-layer not including continuous or semi-continuous fibers or the like as part thereof. The substrate further includes at least one electrically conductive layer as part thereof. An electrical assembly and a method of making the substrate are also provided, as is an information handling system (e.g., computer) incorporating the circuitized substrate of the invention as part thereof.

All of the above applications are assigned to the same Assignee as the present application.

TECHNICAL FIELD

This invention relates to dielectric compositions for use in circuitized substrates such as those utilized in printed circuit boards (hereinafter also referred to as PCBs), chip carriers and the like and, more particularly, to such compositions which, when combined with a supporting structure such as fiber-glass cloth, serve to form dielectric layers that can be used as part of such substrates, e.g., as electrically insulative layers between electrically conductive layers such as signal, power and ground layers which form part of the final structure. Even more particularly, the invention relates to such compositions that will assure such products will be able to include highly dense circuitry in such conductive layers.

BACKGROUND OF THE INVENTION

Circuitized substrates such as printed circuit boards, laminate chip carriers, and the like as used in many of today's technologies must permit the formation of multiple circuits in a minimum volume or space. As indicated above, these end products typically comprise a "stack" of layers of signal, ground and/or power planes (lines) separated from each other by at least one layer of dielectric material. The circuit lines or pads, e.g., those of the signal planes, are often in electrical contact with each other by plated holes passing through the dielectric layers. The plated holes are often referred to as "vias" if internally located, "blind vias" if extending a predetermined depth within the board from an external surface, or "plated-thru-holes" (hereinafter also referred to simply as PTHs) if extending substantially through the board's full thickness. By the term "thru-hole" as used herein is meant to include all three types of such board openings.

The complexity of the resulting products as described herein has increased significantly over the past few years. For example, PCBs for mainframe computers may have as many as thirty-six layers of circuitry or more, with the complete stack having a thickness of as much as about 0.250 inch (250 mils). These boards are typically designed with three or five mil wide signal lines and twelve mil diameter thru-holes. For increased circuit densification in many of today's products such as PCBs, chip carriers and the like, the industry desires to reduce signal lines to a width of two mils or less and thru-hole diameters to two mils or less. Most known commercial procedures, especially those of the nature described herein, are incapable of economically forming the dimensions desired by the industry. Known processes for fabricating PCBs, chip carriers and the like typically comprise fabrication of separate innerlayer circuits (circuitized layers), which are formed by coating a photosensitive layer or film over a copper layer of a copper clad innerlayer base material. The photosensitive coating is imaged, developed and the exposed copper is etched to form conductor lines. After etching, the photosensitive film is stripped from the copper leaving the circuit pattern on the surface of the innerlayer base material. This processing is also referred to as photolithographic processing in the PCB art and further description is not deemed necessary.

After the formation of the individual innerlayer circuits, a multilayer stack is formed by preparing a lay-up of innerlayers, ground planes, power planes, etc., typically separated from each other by a dielectric pre-preg typically comprising a layer of glass (typically fiberglass) cloth impregnated with a partially cured material, typically a B-stage epoxy resin. The top and bottom outer layers of the stack usually comprise copper clad, glass-filled, epoxy planar substrates with the copper cladding comprising exterior surfaces of the stack. The stack is laminated to form a monolithic structure using heat and pressure to fully cure the B-stage resin. The stack so formed typically has metal (usually copper) cladding on both of its exterior surfaces. Exterior circuit layers are formed in the copper cladding using procedures similar to the procedures used to form the innerlayer circuits. A photosensitive film is applied to the copper cladding. The coating is exposed to patterned activating radiation and developed. An etchant is then used to remove copper bared by the development of the photosensitive film. Finally, the remaining photosensitive film is removed to provide the exterior circuit layers.

Electrically conductive thru-holes (also often referred to as interconnects) are often used to electrically connect individual circuit layers within the structure to each other and to the outer surfaces, and typically pass through all or a portion of the stack. Thru-holes are generally formed prior to the formation of circuits on the exterior surfaces by drilling holes through the stack at appropriate locations. Following several pre-treatment steps, the walls of the holes are catalyzed by contact with a plating catalyst and metallized, typically by contact with an electroless or electrolytic copper plating solution to form conductive pathways between circuit layers. Following formation of the conductive thru-holes, exterior circuits, or outerlayers are formed using the procedure described above.

After construction, chips and/or other electrical components are mounted at appropriate locations on the exterior circuit layers of the multilayered stack, typically using solder mount pads to bond the components to the PCB. The components are often in electrical contact with the circuits within the structure through the conductive thru-holes, as desired. The solder pads are typically formed by coating an organic solder mask coating over the exterior circuit layers. The solder mask may be applied by screen coating a liquid solder mask coating material over the surface of the exterior circuit layers using a screen having openings defining areas where solder mount pads are to be formed. Alternatively, a photoimageable solder mask may be coated onto the board and exposed and developed to yield an array of openings defining the pads. The openings are then coated with solder using processes known to the art such as wave soldering.

The necessity of developing ever-increasing high speed circuitized substrates for use in many of today's new products (e.g., computers) has led to the exploration of new materials which would extend the electrical and thermal performance limits of the presently available technology. For high-speed applications, it is necessary to have extremely dense conductor circuitry patterning on low dielectric constant insulating material. Prepreg laminates for conventional circuit boards are traditionally made up of a base reinforcing glass fabric impregnated with a resin, also referred to by some in the industry as "FR4" dielectric material, the FR standing for Flame Retardant and the 4 for the relative value of same. Epoxy/glass laminates, used in some current products, typically contain about 40% by weight fiber glass and 60% by weight epoxy resin, and typically have a relatively high dielectric constant (Er), sometimes higher than 4.0. Such a relatively high Er in turn causes electrical pulses (signals) in adjacent signal circuit lines to propagate less rapidly, resulting in excessive signal delay time. As newer computer systems become faster, system cycle times must become shorter. Delay time contributed by signal travel within the PCB's and other circuitized substrates used in such products will become very significant; hence the need for lower Er laminate materials exists. Many products are expected to require overall Er's of 2.8 or below. Such low Er's are impossible to obtain without new materials since the Er's of conventional FR4 epoxy and common fiber glass, as indicated above, are typically in the 4-6 range. The effective Er of such composite materials can usually be approximated by a simple weighted average of the Er of each individual component and its volume fraction contained in the composite. As further explained below, the above compositions are also often heavily weighted with brominated components, to assure the desired FR rating.

As is known, "pure" fluoropolymers such as polytetrafluoroethylene (PTFE) have Er's of approximately 2.0. However, using such a material alone in construction of a circuit board laminate has sometimes proven impractical, due to generally poor mechanical properties and chemical inertness of this material. One alternative is to use fluoropolymer as one of the components of a composite laminate material, such as the fiber in the reinforcing cloth. An example of this is the treated PTFE fabric prepreg produced by W. L. Gore and Associates, of Newark, Del. When this type of fabric is used to replace fiberglass in conventional epoxy/glass laminates, the Er drops to 2.8. However use of this fabric presents certain disadvantages. Because of the comparatively low modulus of pure PTFE, thin laminates made with these materials are not very rigid, and require special handling care. Also when laminates incorporating PTFE fabric are drilled, uncut PTFE fibers tend to protrude into the drilled holes and are difficult to remove. In order to obtain good plating adhesion, exposed PTFE surfaces must be treated using either an expensive, highly flammable chemical in a nitrogen atmosphere or by plasma processing, which must penetrate high aspect ratio through holes in order to obtain good plating adhesion. Certainly, one of the biggest disadvantages of PTFE fabric laminate is cost, not only the higher cost due to additional processing requirements and equipment modification, but also the considerable cost of purchasing the prepreg material itself. Ideally, the value of the Er should approach as a limit 1.0, the value in a vacuum.

Another property affecting the performance of a laminated dielectric material is the coefficient of thermal expansion (CTE). It is desirable to closely match the coefficients thermal expansion in the X and the Y directions of the dielectric material to that of the adjacent in order to prevent cracking of soldered joints linking the PCB to surface mounted devices, or to avoid separation of copper from the dielectric, or to prevent PCB warping. The X and Y direction CTE's are normally by the glass fibers within the matrix. However these fibers do not control Z direction CTE. Z direction CTE must also be controlled in order to prevent cracking of copper plated through holes during heat cycling. Heat is generated in preparing or reworking solder connections, and in other manufacturing processes, and during current flow when the finished board is in operation or subjected to temperature variations during shipment or storage. One way to modify the CTE is by the use of fillers. Fillers may be linked to the matrix polymer to which these are added by the use of a coupling agent, often a silane. The coupling agent improves the bonding between the filler and the polymer, optimizing the interfacial bond area, which also improves both electrical and mechanical performance. Fillers of various types can affect the dielectric loss of a composite. The CTE of a prepreg dielectric material changes markedly when an inflection point called the glass transition temperature (Tg) is reached. Since the expansion rate of the dielectric material increases considerably when the Tg is reached, it is desirable for a dielectric material to have a high Tg in order to minimize stresses. Epoxy novolac based dielectric materials, for example, are considered to have a relatively high Tg, generally 150 degrees C. or greater. Other characteristics associated with high Tg often include low moisture absorption and chemical resistance.

One known material which attempts to meet many of the above requirements is described in U.S. Pat. No. 5,126,192, entitled "Flame Retardant, Low Dielectric Constant Microsphere Filled Laminate", which issued Jun. 30, 1992. According to the teachings of this patent, a resin/silane treated microsphere/carrier structure prepreg is prepared, B-stage cured, and then vacuum laminated. The impregnation mix is prepared by adding a predetermined quantity of microspheres to the resin/solvent mixture sufficient to result in a packing factor of, e.g., about 50% when the solvent is driven off. A low shear mixing technique must be used to avoid damaging the microspheres. Because these are spherical, the microspheres mix in readily and do not increase the viscosity of the solution to a point beyond which impregnation is difficult. The combination of microsphere size and packing factor enables the filled dielectric material to allegedly withstand the heat and pressure cycle of lamination without undergoing breakage of the hollow microspheres. According to this patent, less than 2% microsphere breakage was observed with lamination pressures up to 500 pounds per square inch (PSI). When breakage does occur, the largest microspheres generally collapse first. Hollow silica microspheres containing less than 2% sodium oxide, with 99% by population less than 40 microns in diameter, apparently provided by a company named Grace Syntactics, Inc. under the name "SDT 28", are described as being acceptable. This same company's "SDT-60" microspheres, sized to 99% by population below 25 microns, are described as the preferred filler. The microspheres are treated with the silane-based coupling agent suitable for use with the specific resin. An especially suitable coupler for these formulations is also mentioned. One coupler mix is described as a combination of vinyl silane and amino silane, for best moisture resistance and acceptable wet dielectric loss performance. Silane resin allegedly binds the filler particles within the resin matrix and minimizes the volume of the interfacial areas between the resin matrix and the microspheres. The carrier/reinforcement material in this patent may be any known shell type reinforcement such as glass or polytetrafluoroethylene (PTFE). The carrier fabric selected depends mostly on the properties desired for the finished laminate. These include thickness, Er, CTE, and the intended product application. Carrier materials include woven and non-woven fiberglass and polymer fabrics and mats. Organic films such as polyimide film can also be used. Low Er fabrics such as D-glass, aramids such as Kevlar and Nomex, both registered trademarks of E. I. Dupont de Nemours and Company, poly p-phenylene benzobisthiazole, poly p-phenylene benzobisoxazole, Polyetheretherketone, aromatic polyesters, quartz, S-glass, and the like, can also be used in the formulation. The reinforcement can be in a cowoven or comingled form.

Another known material designed for use in circuitized substrates such as defined above and which is intended to also meet the above requirements of today's high-speed products is described in U.S. Pat. No. 6,207,595, entitled "Laminate And Method Of Manufacture Thereof", which issued Mar. 27, 2001. In this patent, the dielectric layer's fabric material is made from a cloth member having a low enough content of particulates and a sufficient quantity of resin material to completely encase the cloth member including the particulates, so that the resin material extends beyond the highest protrusions of the cloth member (i.e. the fabric material is thicker and will pass a certain test standard (in '595, the known HAST level A test). Thus, the woven cloth is known to include a quantity of particulates, which term is meant in '595 to include dried film, excess coupler, broken filaments, and gross surface debris. A process is described where a sizing of polyvinyl alcohol, corn starch and a lubricant of oil is applied to the strands of fiber prior to weaving in order to improve the weaving process and minimize breakage of the strands. After weaving, the sizing is removed by a firing step to clean the filaments of lubricants and other materials. However, some sizing is randomly left behind as particulates. Encasing the woven cloth including the particulates is a quantity of hardened resin material. The resin may be an epoxy resin such as one often used for "FR4" composites. A resin material based on bismaleimide-triazine (BT) is also acceptable for the structure in this patent. More preferably, the resin is a phenolically hardenable resin material known in the PCB industry. This patent thus requires continuous fibers (those extending across the entire width (or length) of the dielectric layer except for possible inadvertent interruptions caused by drilling of the thru-holes needed in the final product, causing these fibers to become what might be called as "broken." The aforementioned problem with fiber strands exposed to the holes is thus possible in this patent's process and resulting structure.

In U.S. Pat. No. 5,418,689, there is described a PCB product wherein the dielectric substrate can include a thermoplastic and/or thermosetting resin. Thermosetting polymeric materials mentioned in this patent include epoxy, phenolic base materials, polyimides and polyamides. Examples of some phenolic type materials include copolymers of phenol, resorcinol, and cresol. Examples of some suitable thermoplastic polymeric materials include polyolefins such as polypropylene, polysulfones, polycarbonates, nitrile rubbers, ABS polymers, and fluorocarbon polymers such as polytetrafluoroethylene, polymers of chlorotrifluoroethylene, fluorinated ethylenepropylene polymers, polyvinylidene fluoride and polyhexafluoropropylene. The dielectric materials may be molded articles of the polymers containing fillers and/or reinforcing agents such as glass filled polymers. "FR4" epoxy compositions that are employed in this patent contain 70-90 parts of brominated polyglycidyl ether of bisphenol-A and 10-30 parts of tetrakis (hydroxyphenyl) ethane tetraglycidyl ether cured with 3-4 parts of dicyandiamide, and 0.2-0.4 parts of a tertiary amine, all parts being parts by weight per hundred parts of resin solids. Another "FR4" epoxy composition may contain about 25 to about 30 parts by weight of a tetrabrominated digylcidyl ether of bisphenol-A having an epoxy equivalent weight of about 350 to about 450; about 10 to about 15% by weight of a tetrabrominated glycidyl ether of bisphenol-A having an epoxy equivalent weight of approximately 600 to about 750 and about 55 to about 65 parts per weight of at least one epoxidized nonlinear novolak having at least 6 terminal epoxy groups; along with suitable curing and/or hardening agents. A still further "FR4" epoxy composition contains 70 to 90 parts of brominated polyglycidyl ether of bisphenol-A and 10 to 30 parts of tetrakis (hydroxyphenyl) ethane tetraglycidyl ether cured with 0.8-1 phr of 2-methylimidazole. Still other "FR4" epoxy compositions employ tetrabromobisphenol-A as the curing agent along with 2-methylimidazole as the catalyst.

In U.S. Pat. No. 6,323,436, PCBs are prepared by first impregnating a non-woven aramid chopped fiber mat or a thermoplastic liquid crystalline polymer (LCP) paper instead of the reinforcement typically used in the electronics industry, described in this patent as a woven glass fabric. The aramid reinforcement is comprised of a random (in-plane) oriented mat of p-aramid (poly(p-phenylene terephthalamide) fibers comprised of Kevlar (Kevlar is a registered trademark of E. I. DuPont de Nemours and Company), and has a dielectric constant of 4.0 as compared to 6.1 for standard E-glass cloth. The lower permittivity of the non-woven aramid reinforcement provides for faster signal propagation, allowing increased wiring density and less crosstalk, which becomes increasingly important for high I/O chips and miniaturization. Since the p-aramid fibers are transversely isotropic and have an axial CTE of about −3 to about −6 ppm/degree C. when combined with a thermosetting resin, the final composite described in this patent is said to possess a CTE which can be controlled and adjusted to match that of silicon or semiconductor chips in the range of about 3 to about 10 ppm/degree C. The thermoplastic liquid crystal polymer paper is a material called Vecrus (Vecrus is a registered trademark of Hoechst Celanese Corp.). LCP paper uses the company's Vectra polymer (Vectra also being a registered trademark of Hoechst Celanese Corp.). According to this patent, it has a dielectric constant of 3.25 and a dissipation factor of 0.024 at 60 Hz. The polymer paper has a UL94-V0 rating and an in-plane CTE of less than 10 ppm/degree C. The alleged advantages of this material over the aramid mat are the lower dielectric constant and very low moisture absorption, less than 0.02%. The non-woven aramid or LCP paper is used in conjunction with a thermosetting resin to form the final composite substrate. Examples of thermosetting resins described as being useful in this patent include epoxy, cyanate ester, bismaleimide, bismaleimide-triazine, maleimide or combinations thereof. The resin-impregnated low CTE reinforcement is then partially cured to a "B"-stage to form the prepreg, and then the prepreg is cut, stacked, and laminated to form a subcomposite with exterior copper sheets.

Yet another type of dielectric materials known for use in circuitized substrates include those known as "expanded PTFE" materials, PTFE of course being the designate for polytetrafluoroethylene. A more common example of such material is the aforementioned Teflon, sold by E. I. DuPont de Nemours and Company. In U.S. Pat. No. 5,652,055, for example, there is described an adhesive sheet (or "bond film") material suitable to serve as adhesive layers in a variety of adhesive applications, such as in circuit board laminates, multi-chip modules, and in other electrical applications. The adhesive sheet is described as being constructed from an expanded polytetrafluoroethylene (PTFE) material, such as that taught in U.S. Pat. No. 3,953,566. Preferably, the material is filled with an inorganic filler material and is constructed as follows. A ceramic filler is incorporated into an aqueous dispersion of dispersion-produced PTFE. The filler in small particle form is ordinarily less than 40 microns in size, and preferably less than 15 microns. The filler is introduced prior to co-coagulation in an amount that will provide 10 to 60%, and preferably 40 to 50% by weight filler in the PTFE, in relation to the final resin-impregnated composite. The filled PTFE dispersion is then co-coagulated, usually by rapid stirring. The coagulated filled PTFE is then added. The filled material is then lubricated with a common paste extrusion lubricant, such as mineral spirits or glycols, and then paste extruded. The extrudate is usually calendared, and then rapidly stretched to 1.2 times to 5000 times, preferably 2 times to 100 times, per this patent, at a stretch rate of over 10% per second at a temperature of between 35 degrees C. and 327 degrees C. The lubricant can be removed from the extrudate prior to stretching, if desired. The resulting expanded, porous filled PTFE is then imbibed with adhesive by dipping, calendaring, or doctor blading on a varnish solution of about 2% to 70% adhesive in solvent. The wet composite is then affixed to a tenter frame, and subsequently B-staged at or about 165 degrees C. for 1 to 3 minutes. The resulting sheet adhesive thus obtained typically consists of: (a) 9 to 65 weight percent PTFE; (b) 9 to 60 weight percent inorganic filler, in the form of particulate; and (c) 5 to 60 weight percent adhesive imbibed within the porous structure of the filled PTFE web. Other types of expanded-PTFE substrate materials are described in U.S. Pat. Nos. 4,187,390 and 4,482,516, as well as others. U.S. Pat. No. 4,187,390 is particularly interesting because it delves substantially into both nodes and fibrils used as part of such substrate materials, breaking these down into such dimensional constraints as node height, node width, node length, and fibril length.

In some known dielectric compositions, as mentioned above (e.g., the "FR4" dielectric material), bromine is used as one of the composition elements. Bromine is considered beneficial to provide moisture and flammability resistance and to assist in assuring a high Tg. for the resulting structure. In one known composition, this material is believed to constitute approximately thirty percent (%) of the composition, by weight, in addition to bisphenol-A, a known industrial chemical knowingly used in epoxy resins (and other products), and epoxy cresol novolac resin. However, Applicants are of the opinion that bromine in such relatively high percentages is increasingly considered to be undesirable when used with some resin materials, to the extent that it adversely affects the electrical properties of the base resin.

The present invention represents a significant improvement over dielectric compositions such as those above which are then formed into dielectric layers for use in the production of circuitized substrates such as PCBs. One particularly significant feature of this invention is the provision of a dielectric material which includes, in addition to other elements to be defined in greater detail below, a quantity of silica and a much reduced amount of bromine, thereby assuring a product possessing the desirable properties afforded by bromine but without the undesired aspects believed to exist today. Reduction of the bromine levels while maintaining the requisite FR ratings has resulted in an effective reduction of the laminate material's dielectric constant because the polarization is quantitatively reduced. Additional advantageous features of this composition will be defined in greater detail below. It is believed that such an invention will represent a significant advancement in the art.

OBJECTS AND SUMMARY OF THE INVENTION

It is a primary object of the invention to enhance the art of circuitized substrates.

It is another object to provide an improved dielectric composition which can be utilized to form a dielectric layer within a circuitized substrate and which can be produced successfully using conventional manufacturing procedures.

It is still another object of this invention to provide such a composition that will possess many desirable attributes necessary for successful incorporation with substrates used for high-speed signal passage, as well as in relatively harsh environments (e.g., those of high moisture).

According to one embodiment of the invention, there is provided a dielectric composition adapted for use in circuitized substrates, the dielectric composition comprising a first quantity of a resin and a second quantity of a filler, the dielectric composition only including a minor amount of bromine.

According to another embodiment of the invention, there is provided a circuitized substrate comprising at least one electrically conductive layer and at least one dielectric layer including a supporting material and a dielectric composition including a first quantity of a resin and a second quantity of a filler, this dielectric composition only including a minor amount of bromine.

BEST MODE FOR CARRYING OUT THE INVENTION

For a better understanding of the present invention, together with other and further objects, advantages and capabilities thereof, reference is made to the following disclosure and appended claims.

By the term "circuitized substrate" as used herein is meant a substrate product including one or more dielectric layers and one or more electrically conductive layers. Such products as known in the art included printed circuit boards (a/k/a printed wiring boards) and cards, and chip carriers (substrates adapted for having one or more electronic components such as a semiconductor chip mounted thereon). Typically, the conductive layer(s) is(are) comprised of copper or copper alloy, while previously known dielectric materials include the aforementioned, perhaps the most widely known being the described "FR-4" fiber-glass reinforced resin material. Examples of both such products are described in detail in the foregoing patents and pending patent applications and further description is not believed necessary.

The circuitized substrates produced of the dielectric compositions taught herein are adapted for use in many electronic products, perhaps the best known of these being what may be referred to as "information handling systems." As used herein, this term shall mean any instrumentality or aggregate of instrumentalities primarily designed to compute, classify, process, transmit, receive, retrieve, originate, switch, store, display, manifest, measure, detect, record, reproduce, handle or utilize any form of information, intelligence or data for business, scientific, control or other purposes. Examples include personal computers and larger processors such as computer servers and mainframes. Such products are well known in the art and are also known to include PCBs and other forms of circuitized substrates as part thereof, some including several such components depending on the operational requirements thereof.

As defined herein, the compositions of this invention, when used with cloth supporting material (e.g., fiber-glass), provide a dielectric layer within a circuitized substrate that exhibits reduced dielectric constant, reduced dielectric loss factor, reduced cure shrinkage, reduced coefficient of thermal expansion (CTE), and, further, reduced bromine content. Briefly, the compositions of this invention include only minor amounts of bromine. By the term "minor amount" when defining the amount of bromine in the resulting composition is meant an amount equal to about twenty percent by weight of the composition or less. This is an important aspect of the composition to overcome the undesirable properties described above observed with one or more compositions having more of this material.

The present invention comprises a dielectric composition adapted for use in the above circuitized substrates, the dielectric composition including a first quantity of a resin and a second quantity of a filler material (hereinafter, filler). Significantly, the composition includes only a minor amount of bromine (twenty percent by weight or less of the composition). In one example, the quantity of resin is in fact a combination of three different resin materials, and preferably comprises from about 40 to about 50 percent (%) by weight of the final composition. In a more specific example, the total resin quantity may comprise about 44% by weight of the composition. The first of these resins, sold under the trade name "ECN-1280" resin by Ciba-Geigy Corporation of Tarrytown, N.Y., comprises about 33 percent (%) by weight of the final composition. "ECN-1280" resin is an epoxy resin, more specifically an epoxy cresol novolac resin, which is able to assure low moisture resistance in the resulting dielectric layers. The second resin is a high molecular weight reactive thermosetting resin and comprises about 6 % by weight of the composition. A preferred example is sold under the trade name "PKHS-40" resin, by Inchem Corporation in Rock Hill, S.C. Essentially, the "PKHS-40" resin is a high molecular weight thermosetting resin and serves as a flexibilizer for the composition. The third resin is a tetra-functional resin and comprises about 5 percent by weight of the composition. One purpose of this third resin is to provide desirable UV-florescence properties for the final composition.

The composition of the invention includes the aforementioned quantity of filler. In one example, this filler is silica and comprises from about 10 to about 60% by weight of the composition. Additional filler materials include alumina, aluminum oxide, aluminum nitride, silicon nitride, silicon carbide, beryllium oxide, boron nitride, diamond powder, titanium oxide, ceramic and combinations thereof. One preferred example of such silica is sold by Tatsumori, Ltd., having a business location #2-9-3 Shibakoen Minato-ku, Tokyo, Japan (represented by Tatsumori U.S.A., Inc., New York, N.Y.), under the product names "PLV-6". Another is Tatsumori's "PLV-4" silica. Combinations of these are also possible. These silicas are spherical amorphous silicas, and, in the percentages described above, provide a determining factor in the coefficient of thermal expansion (CTE) for the resulting dielectric layer. The spherical nature of this filler allows high volumetric loading of the filler without driving the melt viscosity of the composition too high to preclude ordinary lamination processing. In one specific example, about 13% by weight of this silica may be used. The silica may be in the form of spherical or semi-spherical amorphous particles or in the form of hollow silica microspheres, or combinations thereof. The silica filler material is an important element in the composition because it allows for the reduction in cloth (supporting material) content while still achieving low (and more isotropic in nature) CTE values for the composition. The inclusion of such a filler can result in an isotropic CTE providing additional reliability to the plated through holes which is another attribute of present composition and invention. The inclusion of silica also improves electrical properties because its displacement of some of the cloth provides the composition with a lower dielectric constant (Er), the cloth having a higher Er value. Since silica also has low moisture absorption properties, its inclusion partially compensates for the reduced resin hydrophobicity which results from the reduced bromine content (more below). Adding a particulate filler such as the silica taught herein would normally increase the brittleness of the dielectric layer, which is undesirable. The addition of the aforementioned "PKHS-40" thermosetting resin, however, assures that such brittleness in the final layer is at a reduced, acceptable level. In one example, the silica particles each have a size within the range of about 200 Angstroms to about 35 microns, a preferred size being about 10 microns. The above ranges are not meant to limit the invention, as others are acceptable for use in the present invention.

As stated, an important feature of the composition of the invention is the utilization of only a minor amount of bromine in the final composition, meaning that the composition includes only about 20% by weight or less of such material. This assures the advantageous features described above and discernible elsewhere herein. In one example, the bromine is part of a hardener which is added to the composition for such a purpose. More specifically, the composition may include about 28% by weight tetrabromobisophenol-A, one such product available under the trade name "TBBA" from Dead Sea Bromine, of Beer Sheva, Israel. In a more specific example, the composition may include about 28 percent by weight of "TBBA", which itself is about 58 percent bromine, leaving a total of only about 16 percent total bromine content. Another hardener used in the composition is sold under the trade name Bisphenol A (or, more simply, BisA) by Dow Chemical of Midland, Mich. Bisphenol A is a chemical compound derived from the combination of one acetone unit with two phenol entities, and is sold by many companies other than Dow Chemical. Approximately 15 percent by weight of the composition may use Bisphenol A. In total, the two hardeners will comprise from about thirty-five to about fifty-five percent by weight of the composition and in one specific example (including the above two in the amounts described), about forty-three percent by weight.

The composition of the invention also preferably includes a coupling agent, a preferred such agent being silane, comprising only about 0.50 percent by weight. In a specific example, the silane may comprise 0.43 percent by weight of the composition. A preferred silane is γ-glycidylpropyltrimethoxy silane, sold under the trade name "Z-6040" silane, by Dow Chemical. Other suitable silanes include γ amino propyl triethoxy silane and β-(3,4-epoxy cyclohexyl)ethyltrimethoxy silane. The coupling agent as used herein functions to assist in chemical bonding of the silica filler and the resin as well as to improve the adhesion between the resulting dielectric material and the conductive layers (e.g., copper) used in circuitized substrates. The silane is added directly to the resin but may also be used to directly treat the silica particles before incorporation within the composition.

The composition defined herein may also include a small amount of 2-methyl imidazole, available from BASF Corporation, having a business location at Florham Park, N.J., to serve as a catalyst for the epoxy resins. Only about 0.11 percent by weight of the composition may be used for this purpose.

The above materials, these being the resins, the silica filler material, the silane, the 2-methyl imidazole, and the hardeners (with the one including the bromine), may be mixed with methyl ethyl ketone (often referred to simply as MEK), a known colorless liquid with an acetone-like odor which is used as a solvent, to produce a liquid varnish of approximately seventy percent by weight solids. This liquid varnish is then coated onto the desired supporting material, a preferred example being cloth and more preferably fiber-glass cloth, many types of which are used in PCB manufacturing. The amount of composition applied to the cloth is dependent on the desired final thickness of the pressed (e.g., laminated) dielectric layer. Significantly, inclusion of the silica filler material as taught herein allows for the use of thinner and lighter styles of glass cloths while still achieving the desired thicknesses and also while maintaining or improving the dimensional changes both in the x-y and vertical planes of a circuitized substrate. The resulting combination of silica filler and thinner, lighter cloths also improves laser drilling of the dielectric layer (to provide the aforementioned thru-holes) by increasing the organic/inorganic homogeneity of the material. The insulation resistance reliability of the laminated material is also improved due to the reduction of the glass fiber contact with conductive material(s). Of further significance, the presence of the silica filler material improves the adhesion of the copper plating and acts to improve crack resistance and improved CITC performance.

The glass cloth may be impregnated with the composition materials, dried, "B-staged" and then laminated in the normal manner (of known PCB lamination processing) with other layers desired for use as part of the finished circuitized substrate, these including the conductive layer(s) and other dielectric layers. The result is a circuitized substrate having the several highly advantageous features defined herein. One example of the key electrical, thermal, physical and thermal expansion properties attainable using the composition of the appended Example is shown in the following Table. Generally speaking, the dielectric layers produced using the teachings of the invention may possess a dielectric constant within the range of from about 3.5 to about 4.0, a Tg within the range of from about 140 deg. C. to about 190 deg. C., a loss factor at 1 MHz within the range of from about 0.008 to about 0.012 and a decomposition temperature within the range of from about 300 deg. C to about 350 deg. C.

EXAMPLE ONE

One hundred and sixty-five grams (gm) of ECN-1280 (e.g., sold by Huntsman, advanced Materials in Brewster, N.Y.), one hundred and forty-one grams of tetrabrobisphenol A (sold by Albemarle Corporation, Baton Rouge La., under the trade name Saytex CP-2000 ), seventy-three grams of bisphenol-A (sold by Sunoco Chemicals, Haverhill, Ohio), twenty-four grams for Epon 1031 (80 percent by wt. solids in MEK) (sold by Resolution Performance Products, Houston, Tex.), and thirty grams of PKHS-40 (40 percent by wt solids in MEK) (sold by InChem Corporation, Rock Hill, S.C.), were mixed with about one hundred grams of MEK in a glass container for a lengthy time to obtain a uniform solution. About 0.6 grams of 2-methyl imidazole (a catalyst) was mixed with 50 grams of MEK and 2.15 grams of Z-6040 coupler (sold by Dow Coming, Midland Mich.). This solution was added to the previous mixture and stirred vigorously to obtain a uniform, well mixed composition. To this solution about sixty-five grams of silica filler PLV-6 (sold by Tatsumori, Tokyo 105 Japan ) were dispersed using a high shear mixer. This composition was later used to produce what is called prepreg (glass cloth impregnated with the resin solution) and subsequently laminated to produce a laminate capable of being used as part of a circuitized substrate.

The above dispersion was used to coat a woven glass cloth. The impregnated cloth was air dried for a few minutes and subsequently placed into an oven at 140 C for about 3 minutes. The prepreg produced from this process had a "pick-up" weight of 7.32 grams for a 4×4 inch square structure including eight plies. The flow exhibited after pressure and heat was applied was about 37 percent. Laminates fabricated from this prepreg using a 200 p.s.i. lamination pressure and 180 deg. C. lamination temperature were tested and the results are shown in the following Table.

TABLE

| | Range |
|---|---|
| Electrical properties | |
| Dk (dielectric constant) @ 1-2.5 GHz (average) | 3.8-4.0 |
| Loss factor at 1 MHz | 0.008-0.012 |
| Thermal properties | |
| Tg (DSC mid point) (deg C.) | 140-190 C. |
| Tg (TMA) (deg C.) | 130-180 C. |
| Decomposition Temperature (deg C.) | 300-330 C. |
| Physical properties | |
| % moisture, 24 hr RT | 0.15-0.30% |
| % moisture 1 hr, PCT | 0.45-1.2% |
| Modulus (M psi) | 3.4-4.0 |
| Elongation (%) | 0.5-2.0 |
| Thermal Expansion | |
| below Tg | |
| x | 14-22 ppm/C. |
| y | 14-22 ppm/C. |
| z | 40-65 ppm/C. |
| above Tg | |
| x | 8-12 ppm/C. |
| y | 5-10 ppm/C. |
| z | 250-300 ppm/C. |

As further understood from the description herein, a particular use for the circuitized substrate formed herein is as part of a chip carrier or a PCB or other electronic packaging product such as those made and sold by the Assignee of the instant invention. One particular example is a chip carrier sold under the name Hyper-BGA chip carrier (Hyper-BGA being a registered trademark of Endicott Interconnect Technologies, Inc.). The invention is of course not limited to chip carriers or even to higher level PCBs. It is also understood that more than one such circuitized substrate (also referred to as a "core", a specific example being what is referred to as a "power core" if the core includes one or more power planes and is thus to serve primarily in this capacity) may be incorporated within such a carrier or PCB, depending on operational requirements desired for the final product. As defined below, the "core" can be readily "stacked up" with other layers, including conductors and dielectric, and bonded together (preferably using conventional PCB lamination processing) to form the multilayered carrier or multilayered PCB. The laminate so formed is then subjected to further processing, including conventional photolithographic processing to form circuit patterns on the outer conductive layers thereof. As described hereinbelow, such external patterns can include conductive pads on which conductors such as solder balls can be positioned to connect the structure to other components such as semiconductor chips, PCBs and chip carriers if so desired. The unique teachings of this invention are thus adaptable to a multitude of electronic packaging products.

While there have been shown and described what are at present considered to be the preferred embodiments of the invention, it will be obvious to those skilled in the art that various changes and modifications may be made therein without departing from the scope of the invention as defined by the appended claims.

What is claimed is:

1. A dielectric composition adapted for use in circuitized substrates, said dielectric composition comprising a hardener, comprising tetrabromobisphenol-A and bisphenol-A, and said dielectric composition further comprising a quantity of a resin and a quantity of a filler, said dielectric composition including an amount of bromine no greater than fifty percent by weight thereof.

2. The dielectric composition of claim 1 wherein said quantity of said resin comprises epoxy resin.

3. The dielectric composition of claim 2 wherein said epoxy resin comprises epoxy cresol novolac resin.

4. The dielectric composition of claim 2 wherein said quantity of said resin further comprises a thermosetting resin.

5. The dielectric composition of claim 4 wherein said quantity of resin comprises from about forty to about fifty percent by weight of said dielectric composition.

6. The dielectric composition of claim 1 wherein said quantity of said filler is selected from the group consisting of alumina, aluminum oxide, aluminum nitride, silicon nitride, silicon carbide, beryllium oxide, boron nitride, diamond powder, titanium oxide, silica, ceramic and combinations thereof.

7. The dielectric composition of claim 6 wherein said filler comprises silica.

8. The dielectric composition of claim 7 wherein said silica is selected from the group consisting of spherical amorphous silica, semi-spherical amorphous silica, hollow silica microspheres and combinations thereof.

9. The dielectric composition of claim 7 wherein said silica comprises from about ten to about sixty percent by weight of said dielectric composition.

10. The dielectric composition of claim 1 further including a coupling agent.

11. The dielectric composition of claim 10 wherein said coupling agent comprises silane.

12. The invention of claim 1 further including supporting material, said dielectric composition and said supporting material combining to form a dielectric layer adapted for use within said circuitized substrates.

13. The invention of claim 12 wherein said supporting material comprises fiber-glass cloth.

14. The invention of claim 12 wherein said dielectric layer has a dielectric constant within the range of from about 3.5 to about 4.0.

15. The invention of claim 12 wherein said dielectric layer has a Tg within the range of from about 140 deg. C. to about 190 deg. C.

16. The invention of claim 12 wherein said dielectric layer has a loss factor at 1 MHz within the range of from about 0.008 to about 0.012.

17. The invention of claim 12 wherein said dielectric layer has a decomposition temperature within the range of from about 300 deg. C. to about 350 deg. C.

* * * * *